United States Patent
Bai et al.

(10) Patent No.: US 9,958,747 B2
(45) Date of Patent: May 1, 2018

(54) ARRAY SUBSTRATE AND MANUFACTURING METHOD THEREOF, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Huibin Guo, Beijing (CN); Yao Liu, Beijing (CN); Xiangqian Ding, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 15/505,376

(22) PCT Filed: Aug. 29, 2016

(86) PCT No.: PCT/CN2016/097180
§ 371 (c)(1),
(2) Date: Feb. 21, 2017

(87) PCT Pub. No.: WO2017/071397
PCT Pub. Date: May 4, 2017

(65) Prior Publication Data
US 2017/0269445 A1    Sep. 21, 2017

(30) Foreign Application Priority Data

Oct. 28, 2015    (CN) .......................... 2015 1 0713642

(51) Int. Cl.
*G02F 1/1362*     (2006.01)
*G02F 1/1343*     (2006.01)
*G02F 1/1368*     (2006.01)

(52) U.S. Cl.
CPC ...... *G02F 1/136227* (2013.01); *G02F 1/1368* (2013.01); *G02F 1/13439* (2013.01);
(Continued)

(58) Field of Classification Search
CPC ........... G02F 1/136227; G02F 1/13439; G02F 1/136286; G02F 2001/136236; G02F 2201/121; G02F 2201/123
(Continued)

(56) References Cited

U.S. PATENT DOCUMENTS 6,204,081 B1 * 3/2001 Kim .................... G02F 1/13458
257/E21.576
6,531,346 B1 * 3/2003 Kim .................. H01L 29/66765
257/E21.414
(Continued)

FOREIGN PATENT DOCUMENTS

CN    102650786 A    8/2012
CN    103715138 A    4/2014
(Continued)

OTHER PUBLICATIONS

International Search Report and Written Opinion dated Dec. 2, 2016; PCT/CN2016/097180.
(Continued)

*Primary Examiner* — Cuong Q Nguyen
*Assistant Examiner* — Tong-Ho Kim
(74) *Attorney, Agent, or Firm* — Ladas & Parry LLP; Loren K. Thompson (57) ABSTRACT

An array substrate and a manufacturing method thereof, a display panel and a display device are disclosed. The method for manufacturing an array substrate includes: forming a first via hole for connecting a second transparent electrically conductive layer and a gate line layer, a second via hole for connecting a first transparent electrically conductive layer
(Continued)

and the second transparent electrically conductive layer, and a third via hole for connecting the second transparent electrically conductive layer and a source/drain electrode layer on a base substrate through patterning process; performing a filling process on the first via hole, the second via hole and the third via hole during a pattern of second transparent electrically conductive layer is being formed, such that each of the three via holes has a top surface which is flush with the second transparent electrically conductive layer surrounding the respective via holes.

18 Claims, 5 Drawing Sheets

(52) U.S. Cl.
CPC .............. *G02F 1/136286* (2013.01); *G02F 2001/136236* (2013.01); *G02F 2201/121* (2013.01); *G02F 2201/123* (2013.01)

(58) Field of Classification Search
USPC .............................................. 257/72; 438/30
See application file for complete search history.

(56) References Cited

U.S. PATENT DOCUMENTS

| | | | |
|---|---|---|---|
| 2002/0042167 | A1 | 4/2002 | Chae |
| 2015/0362769 | A1* | 12/2015 | Huang ................. G02F 1/1368 257/741 |

FOREIGN PATENT DOCUMENTS

| | | |
|---|---|---|
| CN | 105304649 A | 2/2016 |
| JP | 2002-341382 A | 11/2002 |

OTHER PUBLICATIONS

The First Chinese Office Action dated Sep. 5, 2017; Appln. 201510713642.0.

* cited by examiner

ARRAY SUBSTRATE AND MANUFACTURING METHOD THEREOF, DISPLAY PANEL AND DISPLAY DEVICE

TECHNICAL FIELD

Embodiments of the disclosure relate to display technology, more specifically, to an array substrate, a manufacturing method thereof, a display panel and a display device.

BACKGROUND

In the process of manufacturing the thin film transistor liquid crystal display (TFT-LCD), via holes need to be formed in both the interior and the peripheral regions of the display panel. Since via holes and their peripheral areas form a rugged surface, the orientation layer, e.g. polyimide (PI) film, would be unevenly diffused when being coated, thereby seriously impacting the display quality of images in local display areas. For example, PI dark Mura arises in the periphery region of the display panel, and traces are presented due to the uneven brightness of the display.

SUMMARY

The disclosure provides an array substrate and a manufacturing method thereof, a display panel and a display device, in order to reduce the height difference between the top surface of the via hole and the transparent electrically conductive layer surrounding the via hole and to solve the problem of uneven diffusion of the PI orientation layer, thereby increasing display quality.

In first aspect of the disclosure, it is provided a method for manufacturing an array substrate, the method comprises: forming a first via hole for connecting a second transparent electrically conductive layer and a gate line layer, a second via hole for connecting a first transparent electrically conductive layer and the second transparent electrically conductive layer, and a third via hole for connecting the second transparent electrically conductive layer and a source/drain electrode layer on a base substrate through patterning process; performing a filling process on the first via hole, the second via hole and the third via hole during a pattern of second transparent electrically conductive layer is being formed, such that each of the first via hole, the second via hole and the third via hole which are filled has a top surface which is in the same horizontal plane as portions of the second transparent electrically conductive layer surrounding the respective via holes.

In second aspect of the disclosure, it is provided an array substrate which comprises: a base substrate, a first via hole for connecting a second transparent electrically conductive layer and a gate line layer, a second via hole for connecting a first transparent electrically conductive layer and the second transparent electrically conductive layer, a third via hole for connecting the second transparent electrically conductive layer and a source/drain electrode layer, and a pattern of second transparent electrically conductive layer, all of which are formed on the base substrate, wherein each of the first via hole, the second via hole and the third via hole has a filler, and a top surface of the filler is in a same horizontal plane as portions of the second transparent electrically conductive layer surrounding the respective via holes.

In third aspect of the disclosure, it is provided a display panel comprising the above array substrate.

In fourth aspect of the disclosure, it is provided a display device comprising the above display panel.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The thickness of each layer, the shape and size of various regions in the drawings do not represent the actual scale of components on the array substrate and merely intend to schematically illustrate the exemplary embodiment of the disclosure.

Embodiments of the disclosure provide an array substrate and a manufacturing method thereof, a display panel and a display device, in order to reduce the height difference between the top surface of the via hole and the transparent electrically conductive layer surrounding the via hole and to solve the problem of uneven diffusion of the PI orientation layer, thereby increasing display quality.

Embodiment 1

Figure 1:
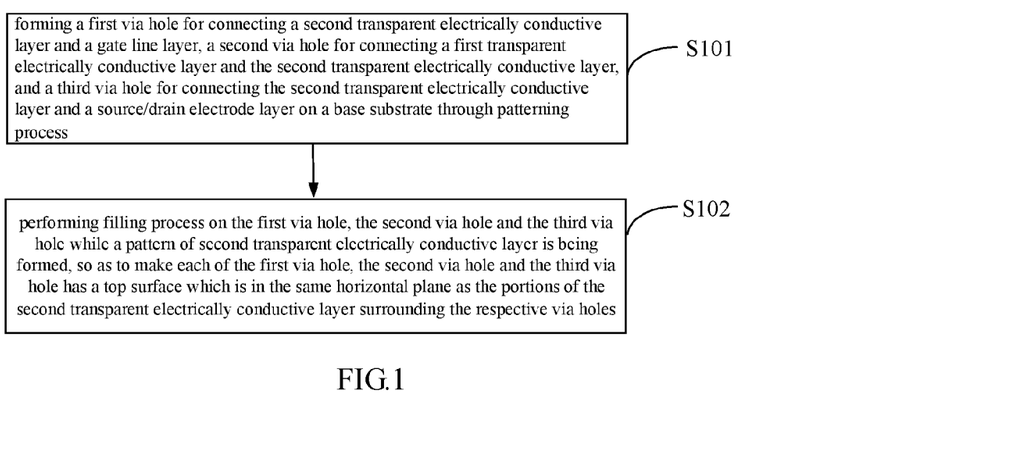
FIG. 1 is a flow chart of a process of manufacturing an array substrate provided by an embodiment of the disclosure.

As illustrated in FIG. 1, an embodiment of the disclosure provides a method for manufacturing an array substrate, the method comprises:

S101. forming a first via hole for connecting a second transparent electrically conductive layer and a gate line layer, a second via hole for connecting a first transparent electrically conductive layer and the second transparent electrically conductive layer, and a third via hole for connecting the second transparent electrically conductive layer and a source/drain electrode layer on a base substrate through patterning process;

S102. performing filling process on the first via hole, the second via hole and the third via hole while a pattern of second transparent electrically conductive layer is being formed, so as to make each of the first via hole, the second via hole and the third via hole has a top surface which is in the same horizontal plane as the portions of the second transparent electrically conductive layer surrounding the respective via holes.

In at least some of the embodiments, the first transparent electrically conductive layer refers to the common electrode layer and the second transparent electrically conductive layer refers to the pixel electrode layer. The first via hole for connecting the second transparent electrically conductive layer and the gate line layer refers to the via hole for connecting the pixel electrode and the gate line layer in the array substrate. The second via hole for connecting the first transparent electrically conductive layer and the second transparent electrically conductive layer refers to the via hole for connecting the pixel electrode and the common electrode line. The third via hole for connecting the second transparent electrically conductive layer and the source/drain electrode layer refers to the via hole for connecting the source/drain electrode and the pixel electrode in a thin film transistor. After the first, second and third via holes are filled, they will be coated with a polyimide (PI) film. So the via holes in S101 and S102 in embodiments of the disclosure refer to the via holes that need to be coated with the PI film.

While the pattern of second transparent electrically conductive layer is being formed, filling process are performed on the first via hole, the second via hole and the third via hole, i.e., the first, second and third via holes are filled with filler, so that each of via holes has a top surface which is in the same horizontal plane as the portion of the second transparent electrically conductive layer surrounding the corresponding via hole. That is, the top surface of the filler in each via hole is flush with the top surface of the portion of the second transparent electrically conductive layer that surrounds the via hole, such that there is no height difference between the top surface of the via hole and the portion of the second transparent electrically conductive layer at the periphery of the via hole. The filler is made of insulation material, such as photoresist. For example, the filler is light-transmitted, and that is not limited in embodiments of the disclosure.

It is noted that, in embodiments of the disclosure, performing filling process on the above three via holes during forming the second transparent electrically conductive layer can further decrease the processing steps and no more extra procedure added. It can be contemplated that the embodiment of performing filling process on the three via holes after the second transparent electrically conductive layer is being formed also falls into the protection scope of the disclosure, if there is no concern about technical procedures. That is, no matter whether during or after the formation of the second transparent electrically conductive layer, the filling process performed on the via holes falls into the protection scope of the disclosure.

According to the manufacturing method of an array substrate provided by embodiments of the disclosure, the top surface of the via hole which has been filled is in the same horizontal plane as the portion of the second transparent electrically conductive layer that surrounds the via hole. Hence, the problem of uneven diffusion, which is due to the height difference between the via hole and the second transparent electrically conductive layer around it, would not arise during the following process of PI coating and PI orientation layer diffusing. Therefore, through the manufacturing method of an array substrate provided by embodiments of the disclosure, the height difference between the top surface of the via hole and the portion of the transparent electrically conductive layer surrounding the via hole is reduced, such that the problem of uneven diffusion of the PI orientation layer is solved, thereby increasing display quality.

In at least some of the embodiments, the step S102 comprises:

performing filling process on the first via hole, the second via hole and the third via hole with photoresist (PR), so as to make each of the first via hole, the second via hole and the third via hole has a top surface which is in the same horizontal plane as the portion of the second transparent electrically conductive layer surrounding the via hole.

It is noted that, the fillers used in the filling process may be photoresist or the like. By using the photoresist, the process of filling via holes in the disclosure is easy to be performed in a convenient and fast way without any difficulties in process. Nonetheless, the material used in the filling process is not limited to photoresist.

Figure 2:
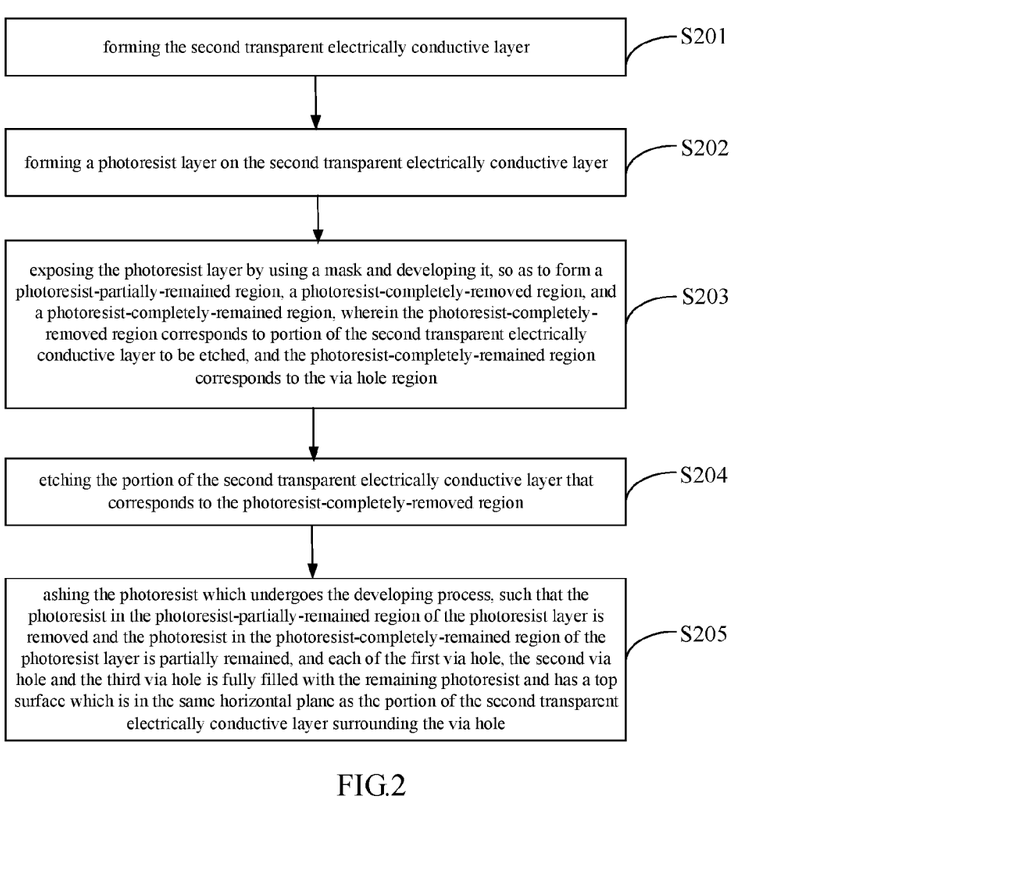
FIG. 2 is a flow chart of a process of manufacturing an array substrate provided by another embodiment of the disclosure.

In at least some of the embodiments, as illustrated in FIG. 2, performing filling process on the first via hole, the second via hole and the third via hole with photoresist, so as to make each of the first via hole, the second via hole and the third via hole has a top surface which is in the same horizontal plane as the portion of the second transparent electrically conductive layer surrounding the via hole comprises:

S201. forming the second transparent electrically conductive layer;

As an example, before the second transparent electrically conductive layer is being formed, a first transparent electrically conductive layer, a gate electrode, a common electrode line, a gate insulation layer, a source/drain electrode layer, a data line and a passivation layer are formed on a base substrate in this order, and the first via hole for connecting the second transparent electrically conductive layer and the gate line layer, the second via hole for connecting the first transparent electrically conductive layer and the second transparent electrically conductive layer, and the third via hole for connecting the second transparent electrically conductive layer and the source/drain electrode layer are formed during the passivation layer is being formed. The transparent electrically conductive layer may be made of transparent electrically conductive material, such as indium tin oxide (ITO).

S202. forming a photoresist layer on the second transparent electrically conductive layer;

S203. exposing the photoresist layer by using a mask and developing it, so as to form a photoresist-partially-remained region, a photoresist-completely-removed region, and a photoresist-completely-remained region, wherein the photoresist-completely-removed region corresponds to portion of the second transparent electrically conductive layer to be etched, and the photoresist-completely-remained region corresponds to the first via hole, the second via hole and the third via hole ("via hole region" for short in the following);

It is noted that, after the second transparent electrically conductive layer is being formed, the region of the substrate where no second transparent electrically conductive layer is required corresponds to the photoresist-completely-removed region, the via hole region that needs to be coated with the PI film corresponds to the photoresist-completely-remained region, and the region where the second transparent electrically conductive layer is required and does not overlap with the via hole region corresponds to the photoresist-partially-remained region.

S204. etching the portion of the second transparent electrically conductive layer that corresponds to the photoresist-completely-removed region;

S205. ashing the photoresist which undergoes the developing process, such that the photoresist in the photoresist-partially-remained region of the photoresist layer is removed and the photoresist in the photoresist-completely-remained region of the photoresist layer is partially remained, and each of the first via hole, the second via hole and the third via hole is fully filled with the remaining photoresist and has a top surface which is in the same horizontal plane as the portion of the second transparent electrically conductive layer surrounding the via hole.

The first via hole, the second via hole and the third via hole are filled with the photoresist while the pattern of second transparent electrically conductive layer is being formed through the processes including photoresist deposition, developing, etching, ashing and the like, so that each of the first via hole, the second via hole and the third via hole has a top surface which is in the same horizontal plane as the portion of the second transparent electrically conductive layer surrounding the via hole. In this way, no extra technical procedure is introduced, the process is simplified and the display quality is increased.

In at least some of the embodiments, the method further comprises: forming via holes that need to be attached to a COF (Chip On Film) while the first via hole, the second via hole and the third via hole are being formed, such as the via holes for connecting a data line and the COF, and the like. In order to prevent the via holes that need to be attached to the COF from being filled, the photoresist at these via holes needs to be ashed. In at least some of the embodiments, for ensuring the photoresist at the via holes that needs to be attached to the COF is completely removed, the photoresist at these via hole that needs to be attached to the COF corresponds to the photoresist-partially-remained region when the ashing process is performed. That is, the photoresist-partially-remained region further correspond to the via holes to be attached to the COF. The amount of the via holes may be one or more than one.

In at least some of the embodiments, the photoresist-completely-remained region have a height greater than that of the photoresist-partially-remained region, and when the amount of the via holes to be attached to the COF is more than one, the height difference between the photoresist-completely-remained region and the photoresist-partially-remained region is greater than or equal to the depth of all of the via holes to be attached to the COF.

The thicknesses of the photoresist that is ashed in once ashing process are the same. In order to ensure that the photoresist in the photoresist-partially-remained region is completely removed and that the photoresist in the photoresist-completely-remained region is partially remained after the photoresist is being ashed, in at least some of the embodiments, the height of the photoresist in the photoresist-completely-remained region is set to be greater than that of the photoresist in the photoresist-partially-remained region, and the height difference between the photoresist-completely-remained region and the photoresist-partially-remained region is greater than or equal to the depth of all of the via holes that need to be attached to the COF.

It is noted that, the via holes that need to be attached to the COF refer to the via holes that need to be connected to the COF in the subsequent process, such as the via holes located around the data line at the periphery of the display panel, and the like. "The height difference between the photoresist-completely-remained region and the photoresist-partially-remained region is greater than or equal to the depth of all of the via holes that need to be attached to the COF" refers to that the height difference between the photoresist-completely-remained region and the photoresist-partially-remained region is at least greater than or equal to the maximum depth of all of the via holes to be attached to the COF.

Figure 3:
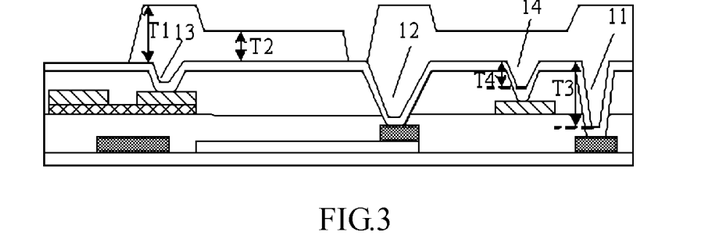
FIG. 3 schematically illustrates a configuration of via holes and photoresist in an array substrate provided by an embodiment of the disclosure.

In at least some of the embodiments, as illustrated in FIG. 3, the photoresist on the via hole 11, the via hole 12 and the via hole 13 has a thickness of T1, the photoresist on the via hole 14 has a thickness of T2, and the via hole 11 has a depth of T3. In the present embodiment, the via hole 11, the via hole 12 and the via hole 13 are the via holes which need to be coated with the PI film, and the via hole 14 is the via hole which needs to be attached to the COF, i.e., not coated with the PI film. The depth of the via hole 14 is T4. Other via holes that need to be attached to the COF are not illustrated in FIG. 3, and the via hole 14 is supposed to be the deepest one among the via holes that need to be attached to the COF. Hence, the via hole 11, the via hole 12, and the via hole 13 illustrated in the drawings need to be filled with photoresist. As illustrated in FIG. 3, in the same horizontal plane, the photoresist with a thickness of T1 corresponds to the photoresist-completely-remained region, and the photoresist with a thickness of T2 corresponds to the photoresist-partially-remained region. In order to ensure that the photoresist in the via hole 11, the via hole 12 and the via hole 13 could be remained, the photoresist with a thickness of T1 needs to be ashed and the photoresist with a thickness of T2 in the photoresist-partially-remained region needs to be completely removed during ashing process. In order to completely ash the photoresist in the via hole 14 to be attached to the COF, the thickness of the photoresist that needs to be ashed is T2+T4. That is, T1≥(T2+T4), i.e., T1−T2≥T4. Therefore, the height difference (T1−T2) between the photoresist-completely-remained region and the photoresist-partially-remained region is at least greater than or equal to the deepest depth T4 of the via hole 14 among all the via holes that need to be attached to the COF to ensure that the photoresist in the via hole 14 could be ashed completely.

In another embodiment, the via hole 11 for connecting the gate line and the second transparent electrically conductive layer has the greatest depth among the via holes to be coated with the PI film, and the depth T4 of the via hole 14 is less than the depth T3 of the via hole 11 to be coated with the PI film. Hence, in order to further ensure that the photoresist in the via hole 14 is completely removed, the parameter T1≥T2+T3 is adopted, i.e., T1−T2≥T3. The height difference (T1−T2) between the photoresist-completely-remained region and the photoresist-partially-remained region is at least greater than or equal to the depth T3 of the deepest via hole among all the via holes that need to be coated with the PI film.

It is noted that, the embodiments of the disclosure merely take it for example that the via hole for connecting the second transparent electrically conductive layer and the gate line layer is the deepest one among the via holes that need to be coated with the PI film and the via hole 14 is the deepest one among the via holes that need to be attached to the COF, so as to describe the notes for ashing in detail, thereby achieving the aim of filling the via holes. It can be contemplated that any other via hole which has the greatest depth and its depth fulfill the above size relation could also achieve the aim of filling the via holes of the disclosure, which is not limited in the disclosure.

In at least some of the embodiments, the mask is a half-tone mask, a gray-tone mask or a mask with slits.

In the embodiments of the disclosure, the photoresist is exposed by using the mask and subsequently developed. In order to pattern the photoresist layer into the photoresist-completely-removed region, photoresist-partially-remained region and photoresist-completely-remained region, the mask is typically a half-tone mask, a gray-tone mask or a mask with slits.

In conclusion, the manufacturing method of an array substrate provided by embodiments of the disclosure comprises: forming via holes on a base substrate, the via holes including the via holes that subsequently need to be coated with the PI film and the via holes that subsequently need to be attached to the COF; and performing filling process on the via holes subsequently need to be coated with the PI film with a photoresist while the pattern of second transparent electrically conductive layer is being formed, such that the via holes which have been filled each has a top surface that is in the same horizontal plane as the portion of the second transparent electrically conductive layer surrounding the via hole. In order to prevent the via holes that need to be attached to the COF from being filled, the photoresist at the via holes to be attached to the COF needs to be removed completely during the ashing process. Therefore, during the photoresist layer is being formed, the photoresist is exposed by using a mask and subsequently developed to form the photoresist-partially-remained region, the photoresist-completely-removed region and a photoresist-completely-remained region, wherein the photoresist-partially-remained region corresponds to the area of the via holes to be attached to the COF, the photoresist-completely-removed region corresponds to the area where portion of the second transparent electrically conductive layer needs to be etched, and the photoresist-completely-remained region corresponds to the area of the via holes to be coated with the PI film. The photoresist-completely-remained region has a height greater than that of the photoresist-partially-remained region, and the height difference between the photoresist-completely-remained region and the photoresist-partially-remained region is greater than or equal to the depth of all of the via holes that need to be attached to the COF. In this way, only the via holes that subsequently need to be coated with the PI film are filled with photoresist. Hence the problem of uneven diffusion of the orientation layer (PI film), which is due to the height difference between the via hole and the second transparent electrically conductive layer surrounding it and impacts the display quality, would not arise on the array substrate. Therefore, through the manufacturing method of an array substrate provided by embodiments of the disclosure, the height difference between the top surface of the via hole and the portion of the transparent electrically conductive layer surrounding the via hole is reduced, such that the problem of uneven diffusion of the PI orientation layer is solved, thereby increasing display quality.

Figure 4:
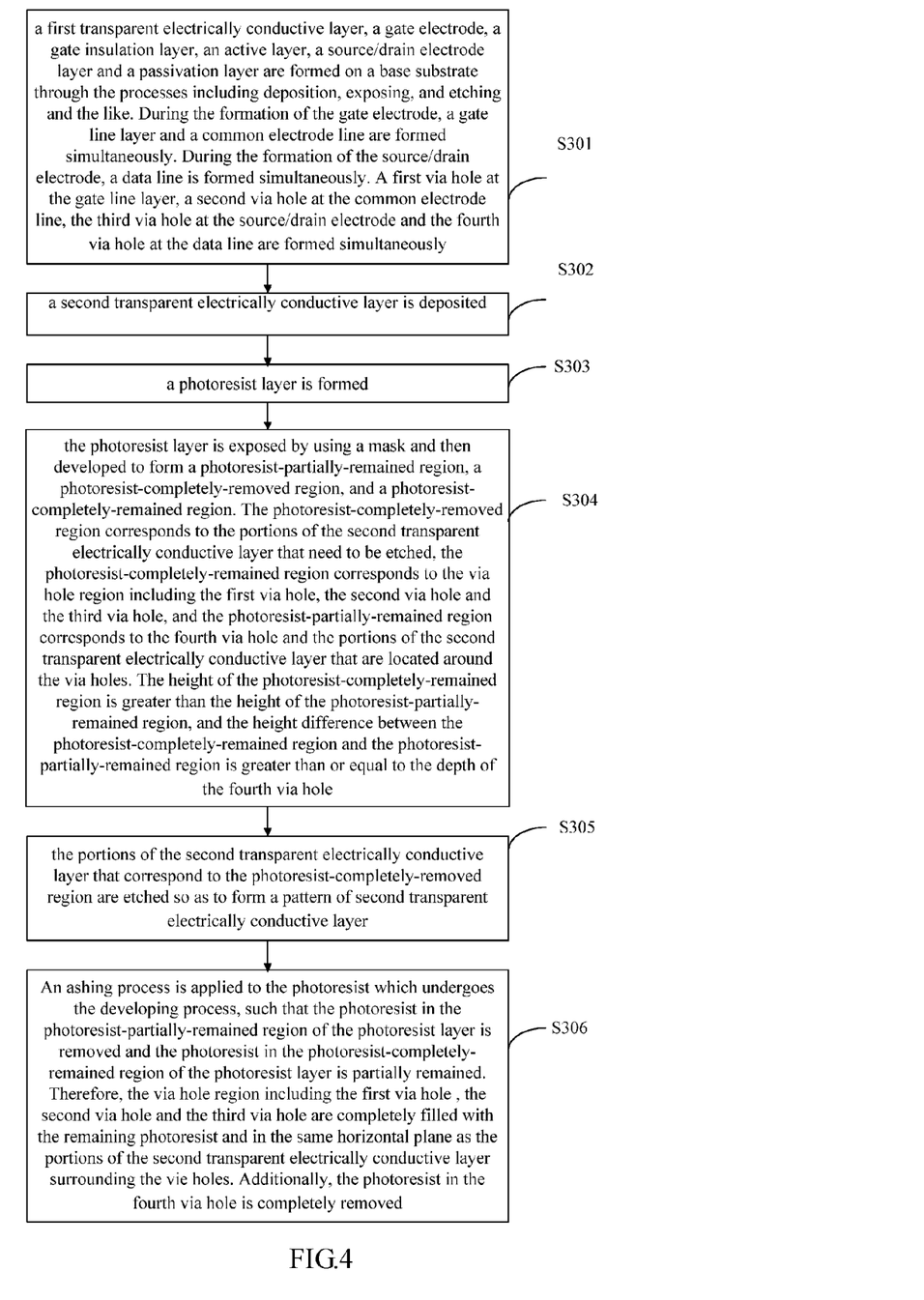
FIG. 4 is a flow chart of a process of manufacturing an array substrate provided by still another embodiment of the disclosure.
Figure 5:
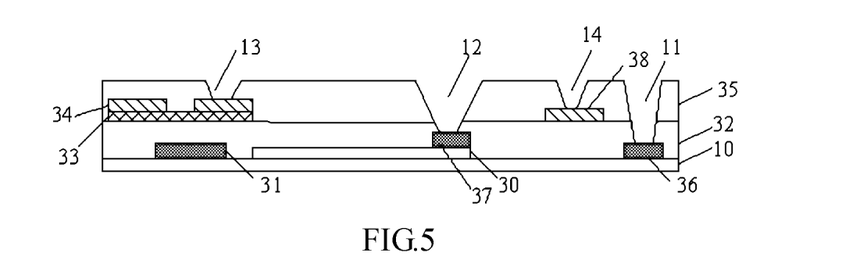
FIG. 5 to FIG. 10 illustrate cross sections of an array substrate during various steps of the process of manufacturing the array substrate provided by an embodiment of the disclosure.
Figure 6:
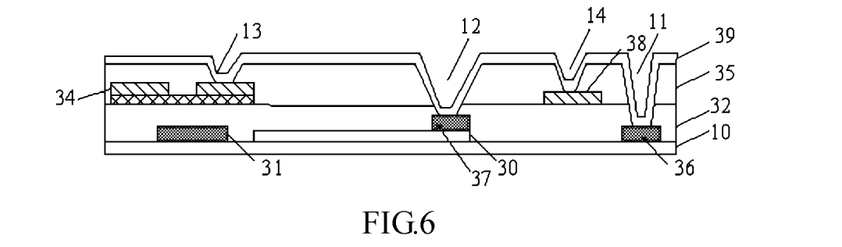
Figure 7:
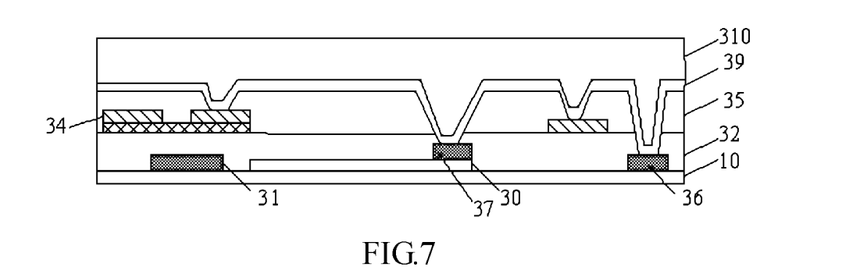
Figure 8:
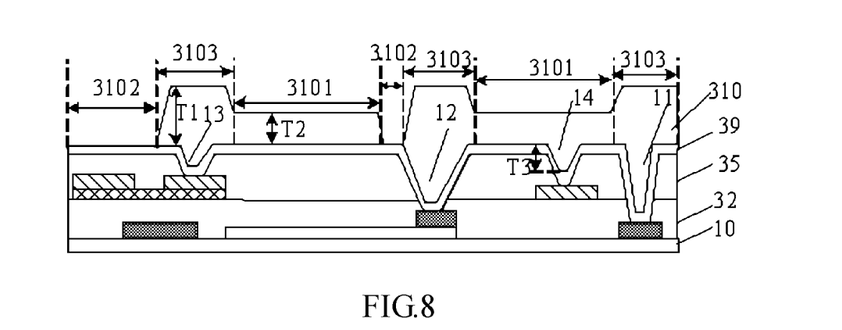
Figure 9:
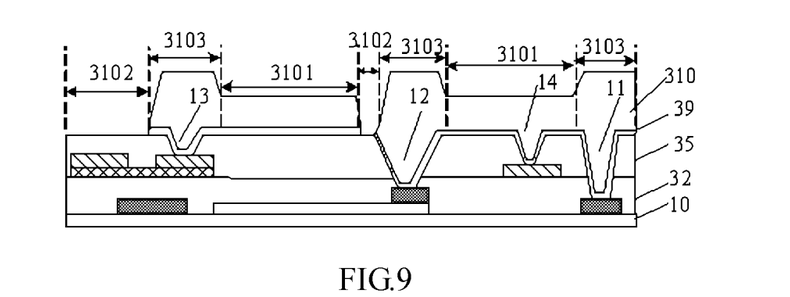
Figure 10:
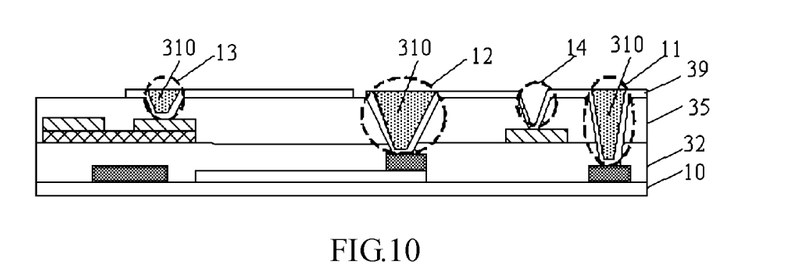

In the followings, the manufacturing method of an array substrate is described in detail with reference to accompanying drawings. As illustrated in FIG. 4, the method comprises:

S301. As illustrated in FIG. 5, a first transparent electrically conductive layer 30, a gate electrode 31, a gate insulation layer 32, an active layer 33, a source/drain electrode layer 34 and a passivation layer 35 are formed on a base substrate 10 through the processes including deposition, exposing, and etching and the like. During the formation of the gate electrode, a gate line layer 36 and a common electrode line 37 are formed simultaneously. During the formation of the source/drain electrode, a data line 38 is formed simultaneously. A first via hole 11 at the gate line layer, a second via hole 12 at the common electrode line 37, the third via hole 13 at the source/drain electrode and the fourth via hole 14 at the data line are formed simultaneously;

S302. As illustrated in FIG. 6, based on the structure illustrated in FIG. 5, a second transparent electrically conductive layer 39 is deposited;

S303. As illustrated in FIG. 7, based on the structure illustrated in FIG. 6, a photoresist layer 310 is formed;

S304. As illustrated in FIG. 8, the photoresist layer 310 is exposed by using a mask and then developed to form a photoresist-partially-remained region 3101, a photoresist-completely-removed region 3102, and a photoresist-completely-remained region 3103. The photoresist-completely-removed region 3102 corresponds to the portions of the second transparent electrically conductive layer that need to be etched, the photoresist-completely-remained region 3103 corresponds to the via hole region including the first via hole 11, the second via hole 12 and the third via hole 13, and the photoresist-partially-remained region corresponds to the fourth via hole 14 and the portions of the second transparent electrically conductive layer that are located around the via holes. The height T1 of the photoresist-completely-remained region 3103 is greater than the height T2 of the photoresist-partially-remained region 3101, and the height difference (T1−T2) between the photoresist-completely-remained region 3103 and the photoresist-partially-remained region 3101 is greater than or equal to the depth T3 of the fourth via hole 14;

S305. As illustrated in FIG. 9, the portions of the second transparent electrically conductive layer that correspond to the photoresist-completely-removed region 3102 are etched so as to form a pattern of second transparent electrically conductive layer;

S306. An ashing process is applied to the photoresist which undergoes the developing process, such that the photoresist in the photoresist-partially-remained region 3101 of the photoresist layer is removed and the photoresist in the photoresist-completely-remained region 3103 of the photoresist layer is partially remained. Therefore, the via hole region including the first via hole 11, the second via hole 12 and the third via hole 13 are completely filled with the remaining photoresist and in the same horizontal plane as the portions of the second transparent electrically conductive layer surrounding the vie holes. Additionally, the photoresist in the fourth via hole 14 is completely removed, as illustrated in FIG. 10.

It is noted that, in the present embodiment, the process of filling via holes with photoresist is just taken as an example to illustrate the manufacturing process of an array substrate, and filling via holes with other filler also fall into the protection scope of the disclosure.

Figure 11:
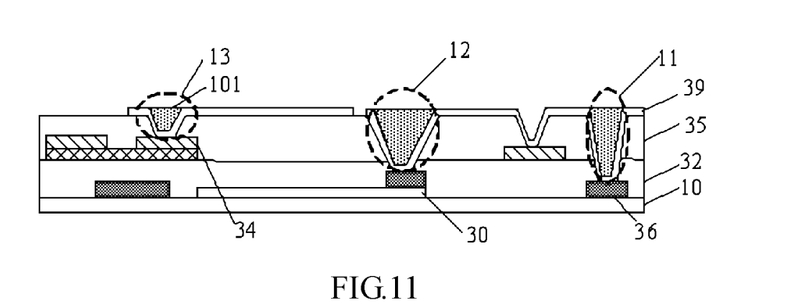
FIG. 11 illustrates a cross section of an array substrate provided by an embodiment of the disclosure.

As illustrated in FIG. 11, an embodiment of the disclosure provides an array substrate, which comprises: a base substrate, on which formed the following components: a first via hole 11 for connecting a second transparent electrically conductive layer 39 and a gate line layer 36; a third via hole 13 for connecting the second transparent electrically conductive layer 39 and a source/drain electrode layer 34; a second via hole 12 for connecting a first transparent electrically conductive layer 30 and the second transparent electrically conductive layer 39; and a pattern of second transparent electrically conductive layer 39. The second transparent electrically conductive layer has fillers at the first via hole 11, the second via hole 12 and the third via hole 13, such that the top surface of the first via hole 11, the second via hole 12 and the third via hole 13 is in the same horizontal plane as the portions of the second transparent electrically conductive layer 39 surrounding these via holes.

It is noted that, the filler in the embodiments of the disclosure may be photoresist or the like, which is not limited by embodiments of the disclosure.

The array substrate according to embodiments of the disclosure has fillers in each of the via hole connecting the second transparent electrically conductive layer and the gate line, the via hole connecting the second transparent electrically conductive layer and the source/drain electrode layer, and the via hole connecting the first transparent electrically conductive layer and the second transparent electrically conductive layer, such that the top surface of each of the via holes is in the same horizontal plane as the portion of the second transparent electrically conductive layer surrounding the respective via holes. As a result, the problem of uneven diffusion of the PI orientation layer, which is due to the rugged surface of via holes and could impact the display quality of images, would not arise on the array substrate. Therefore, the array substrate provided by embodiments of the disclosure could increase the display quality of images.

A display panel provided in an embodiment of the disclosure comprises the array substrate provided in embodiments of the disclosure.

A display device provided in an embodiment of the disclosure comprises the display panel provided in embodiments of the disclosure.

What is described above is related to the illustrative embodiments of the disclosure only and not limitative to the scope of the disclosure; the scopes of the disclosure are defined by the accompanying claims.

The present application claims the priority of Chinese patent application No. 201510713642.0 filed on Oct. 28, 2015, the disclosure of which is incorporated herein by reference in its entirety.

The invention claimed is:

1. A method for manufacturing an array substrate comprising:
    forming a first via hole for connecting a second transparent electrically conductive layer and a gate line layer, a second via hole for connecting a first transparent electrically conductive layer and the second transparent electrically conductive layer, and a third via hole for connecting the second transparent electrically conductive layer and a source/drain electrode layer on a base substrate through patterning process;
    performing a filling process on the first via hole, the second via hole and the third via hole during a pattern of second transparent electrically conductive layer is being formed, such that each of the first via hole, the second via hole and the third via hole are filled with a filler, and a top surface of the filler in each of the first via hole, the second via hole and the third via hole is in the same horizontal plane as portions of the second transparent electrically conductive layer surrounding the respective via holes.

2. The method of claim 1, wherein performing a filling process on the first via hole, the second via hole and the third via hole during a pattern of second transparent electrically conductive layer is being formed, such that each of the first via hole, the second via hole and the third via hole which are filled has a top surface which is in the same horizontal plane as portions of the second transparent electrically conductive layer surrounding the respective via holes comprises:
    performing the filling process on the first via hole, the second via hole and the third via hole with a photoresist, such that each of the first via hole, the second via hole and the third via hole which are filled has a top surface which is in the same horizontal plane as portions of the second transparent electrically conductive layer surrounding the respective via holes.

3. The method of claim 2, wherein performing the filling process on the first via hole, the second via hole and the third via hole with a photoresist, such that each of the first via hole, the second via hole and the third via hole which are filled has a top surface which is in the same horizontal plane as portions of the second transparent electrically conductive layer surrounding the respective via holes:
    forming the second transparent electrically conductive layer;
    forming a photoresist layer on the second transparent electrically conductive layer;
    exposing the photoresist layer by using a mask and then developing to form a photoresist-partially-remained region, a photoresist-completely-removed region, and a photoresist-completely-remained region, wherein the photoresist-completely-removed region corresponds to portions of the second transparent electrically conductive layer, the photoresist-completely-remained region corresponds to the first via hole, the second via hole and the third via hole;
    etching the portions of the second transparent electrically conductive layer that correspond to the photoresist-completely-removed region;
    ashing the photoresist which undergoes the developing process, such that the photoresist in the photoresist-partially-remained region is removed, the photoresist in the photoresist-completely-remained region is partially remained, each of the first via hole, the second via hole and the third via hole is completely filled with the remaining photoresist and is in the same horizontal plane as portions of the second transparent electrically conductive layer surrounding the respective via holes.

4. The method of claim 3, wherein the mask is a half-tone mask, a gray-tone mask or a mask with slits.

5. The method of claim 3, further comprising:
    forming a via hole to be attached to a chip on film (COF) during the formation of the first via hole for connecting the second transparent electrically conductive layer and the gate line layer, the second via hole for connecting the first transparent electrically conductive layer and the second transparent electrically conductive layer, and the third via hole for connecting the second transparent electrically conductive layer and the source/drain electrode layer.

6. The method of claim 5, wherein the photoresist-partially-remained region further corresponds to the via hole to be attached to the COF.

7. The method of claim 6, wherein the photoresist-completely-remained region has a height greater than that of the photoresist-partially-remained region, and a height difference between the photoresist-completely-remained region and the photoresist-partially-remained region is greater than or equal to a depth of the via hole to be attached to the COF.

8. An array substrate comprising: a base substrate, a first via hole for connecting a second transparent electrically conductive layer and a gate line layer, a second via hole for connecting a first transparent electrically conductive layer and the second transparent electrically conductive layer, a third via hole for connecting the second transparent electrically conductive layer and a source/drain electrode layer, and a pattern of second transparent electrically conductive layer, all of which are formed on the base substrate, wherein each of the first via hole, the second via hole and the third via hole is filled with a filler, and a top surface of the filler in each of the first via hole, the second via hole and the third via hole is in a same horizontal plane as portions of the second transparent electrically conductive layer surrounding the respective via holes.

9. The array substrate of claim 8, wherein the array substrate further comprises a via hole to be attached to a chip on film (COF).

10. A display panel comprising the array substrate of claim 9.

11. The array substrate of claim 9, wherein a depth of the via hole to be attached to a chip on film (COF) is less than a depth of the first via hole.

12. A display panel comprising the array substrate of claim 8.

13. A display device comprising the display panel of claim 12.

14. The array substrate of claim 8, wherein the filler comprises a photoresist.

15. The array substrate of claim 8, wherein the filler further comprises the second transparent electrically conductive layer.

16. The array substrate of claim 15, wherein the photoresist in each of the first via hole, the second via hole and the third via hole overlays the second transparent electrically conductive layer.

17. The array substrate of claim 8, wherein each of the first via hole, the second via hole and the third via hole is to be coated with an orientation film.

18. The array substrate of claim 17, wherein the first via hole has a greatest depth among three via holes to be coated with the orientation film.

* * * * *